(12) United States Patent
Hsieh et al.

(10) Patent No.: US 12,006,461 B2
(45) Date of Patent: Jun. 11, 2024

(54) LIGHT COLOR CONVERSION MATERIAL AND LIGHT COLOR CONVERSION INK

(71) Applicant: Industrial Technology Research Institute, Hsinchu (TW)

(72) Inventors: Pao-Ju Hsieh, Hsinchu County (TW); Mei-Chih Peng, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 17/742,365

(22) Filed: May 11, 2022

(65) Prior Publication Data

US 2023/0212459 A1     Jul. 6, 2023

(30) Foreign Application Priority Data

Dec. 30, 2021   (TW) ................. 110149557

(51) Int. Cl.
| | | |
|---|---|---|
| *C09K 19/34* | (2006.01) |
| *C09D 11/033* | (2014.01) |
| *C09K 19/12* | (2006.01) |
| *C09K 19/20* | (2006.01) |
| *C09K 19/22* | (2006.01) |
| *C09K 19/32* | (2006.01) |
| *C09K 19/58* | (2006.01) |
| *H10K 50/115* | (2023.01) |
| *B82Y 15/00* | (2011.01) |

(52) U.S. Cl.
CPC ........ *C09K 19/3405* (2013.01); *C09D 11/033* (2013.01); *C09K 19/12* (2013.01); *C09K 19/2007* (2013.01); *C09K 19/22* (2013.01); *C09K 19/322* (2013.01); *C09K 19/586* (2013.01); *H10K 50/115* (2023.02); *B82Y 15/00* (2013.01); *C09K 2019/122* (2013.01); *C09K 2019/2035* (2013.01); *C09K 2019/2085* (2013.01); *C09K 2019/323* (2013.01); *C09K 2019/3408* (2013.01)

(58) Field of Classification Search
CPC ............. C09K 19/3405; C09K 19/12; C09K 19/2007; C09K 19/22; C09K 19/322; C09K 19/586; C09K 2019/122; C09K 2019/2035; C09K 2019/2085; C09K 2019/323; C09K 2019/3408; C09D 11/033; H01L 51/502; B82Y 15/00
See application file for complete search history.

(56) References Cited

U.S. PATENT DOCUMENTS

| | | | |
|---|---|---|---|
| 9,293,654 | B2 | 3/2016 | Demir et al. |
| 9,753,198 | B2 | 9/2017 | Saitoh et al. |
| 10,501,688 | B2 | 12/2019 | Liu et al. |
| 10,768,485 | B2 | 9/2020 | Pickett et al. |
| 10,985,296 | B2 | 4/2021 | Hartlove et al. |
| 2018/0143492 | A1 | 5/2018 | Kao et al. |
| 2021/0043863 | A1 | 2/2021 | Jung |

FOREIGN PATENT DOCUMENTS

| | | | |
|---|---|---|---|
| CN | 106381140 | | 2/2017 |
| CN | 106833679 | | 6/2017 |
| CN | 106711350 | | 5/2018 |
| CN | 108251116 | | 7/2018 |
| CN | 105717700 | | 11/2018 |
| CN | 107118773 | | 3/2020 |
| CN | 111051934 | | 4/2020 |
| CN | 111308785 | A * | 6/2020 ........... G02F 1/1333 |
| CN | 111320898 | | 6/2020 |
| CN | 111435206 | | 7/2020 |
| CN | 111443524 | | 7/2020 |
| CN | 112852405 | | 5/2021 |
| CN | 213124443 | | 5/2021 |
| JP | 2021043445 | | 3/2021 |
| TW | 201007250 | | 2/2010 |
| TW | 201624089 | | 7/2016 |
| TW | I567124 | | 1/2017 |
| WO | 2021251742 | | 12/2021 |

OTHER PUBLICATIONS

"Encapsulate." Merriam-Webster.com Dictionary, Merriam-Webster, https://www.merriam-webster.com/dictionary/encapsulate. Accessed Jan. 27, 2023. (Year: 2023).*

* cited by examiner

*Primary Examiner* — Geraldina Visconti
(74) *Attorney, Agent, or Firm* — JCIPRNET

(57) ABSTRACT

Provided are a light color conversion material and a light color conversion ink. The light color conversion material includes a quantum dot and a cross-linkable cholesteric liquid crystal material. The cross-linkable cholesteric liquid crystal material encapsulates the quantum dot. The cross-linkable cholesteric liquid crystal material has Bragg diffraction characteristic after cross-linking, and blue light with a wavelength between 400 nm and 480 nm may be reflected by the cross-linked cholesteric liquid crystal material and transmitted through the cross-linked cholesteric liquid crystal material at the same time.

6 Claims, 1 Drawing Sheet

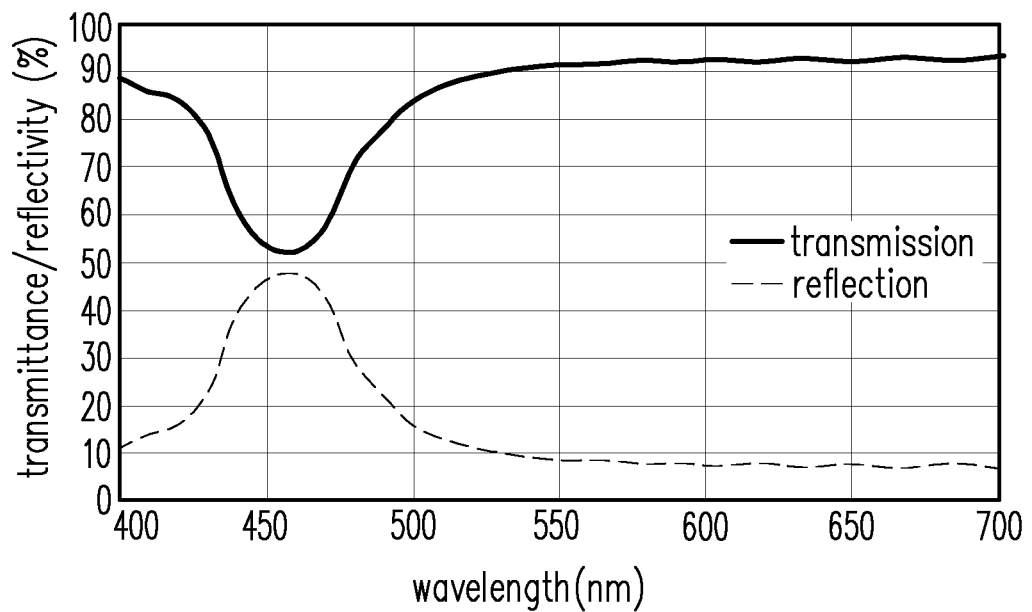

LIGHT COLOR CONVERSION MATERIAL AND LIGHT COLOR CONVERSION INK

CROSS-REFERENCE TO RELATED APPLICATION

This application claims the priority benefit of Taiwan application serial no. 110149557, filed on Dec. 30, 2021. The entirety of the above-mentioned patent application is hereby incorporated by reference herein and made a part of this specification.

TECHNICAL FIELD

The present disclosure relates to a light color conversion material and a light color conversion ink.

BACKGROUND

Quantum dot (QD) is a semiconductor material with nanometer size, usually less than 100 nm, and crystal structure, which may include hundreds to thousands of atoms. The quantum dot has the characteristics of high fluorescence brightness, high color purity, good photostability and good thermal stability. As a result, the quantum dot has been widely used in display devices. However, how to improve the quantum efficiency and the light color conversion efficiency of the quantum dot is still an extremely important issue for the technology.

SUMMARY

An embodiment of the present disclosure provides a light color conversion material including a quantum dot and a cross-linkable cholesteric liquid crystal material. The cross-linkable cholesteric liquid crystal material encapsulates the quantum dot. The cross-linkable cholesteric liquid crystal material has Bragg diffraction characteristic after cross-linking, and blue light with a wavelength between 400 nm and 480 nm may be reflected by the cross-linked cholesteric liquid crystal material and transmitted through the cross-linked cholesteric liquid crystal material at the same time.

An embodiment of the present disclosure provides a light color conversion ink including a solvent and the above light color conversion material. The light color conversion material is dispersed in the solvent.

To make the aforementioned more comprehensible, several embodiments accompanied with drawings are described in detail as follows.

BRIEF DESCRIPTION OF THE DRAWINGS

FIGURE a graph showing the relationship between transmittance/reflectivity and wavelength of light for a cross-linked cholesteric liquid crystal material in the light color conversion material according to an embodiment of the present disclosure.

DETAILED DESCRIPTION

In the embodiment of the present disclosure, after the light color conversion material is irradiated by light with a wavelength between 400 nm and 480 nm, for example, blue light, the incident light may be reflected by the light color conversion material and transmitted through the light color conversion material at the same time. A diffraction resonance, i.e., Bragg diffraction, may be generated after the incident light is coupled by multiple reflections. In this way, the incident light with the wavelength range described above may break through the energy gap of the quantum dot, thus improving the absorption of the incident light by the light color conversion material. As a result, the light color conversion material may have a higher optical density (OD). Thereby, the excitation conversion of the quantum dot is increased, thus improving the emission fluorescence intensity and the light color conversion efficiency. The light color conversion material of the embodiment of the present disclosure will be described in detail below.

The light color conversion material of the embodiment of the present disclosure includes a quantum dot and a cross-linkable cholesteric liquid crystal material. The quantum dot is encapsulated by the cholesteric liquid crystal material, so that the surface of the quantum dot is covered with a layer of cholesteric liquid crystal material. In the present embodiment, the cross-linkable cholesteric liquid crystal material has Bragg diffraction characteristic after being cross-linked, and thus the blue light with a wavelength between 400 nm and 480 nm may be reflected by the cross-linked cholesteric liquid crystal material and transmitted through the cross-linked cholesteric liquid crystal material at the same time. In the present embodiment, "the light with a wavelength between 400 nm and 480 nm may be reflected by the cross-linked cholesteric liquid crystal material and transmitted through the cross-linked cholesteric liquid crystal material at the same time" means that the cross-linked cholesteric liquid crystal material has a characteristic of selective reflection/transmission of light with the wavelength between 400 nm and 480 nm. The light with the wavelength between 400 nm and 480 nm is, for example, blue light. Referring to FIGURE, after the cross-linkable cholesteric liquid crystal material is cross-linked, when the light color conversion material is irradiated with light with a wavelength between 400 nm and 480 nm, the light may be reflected by the cross-linked cholesteric liquid crystal material and transmitted through the cross-linked cholesteric liquid crystal material at the same time.

In the present embodiment, the cholesteric liquid crystal material includes an optical active substance and a nematic liquid crystal monomer having at least one photopolymerizable acrylic functional group.

In one embodiment, the optical active substance may be at least one compound represented by one of [Formula 1-1] to [Formula 1-16].

[Formula 1-1]
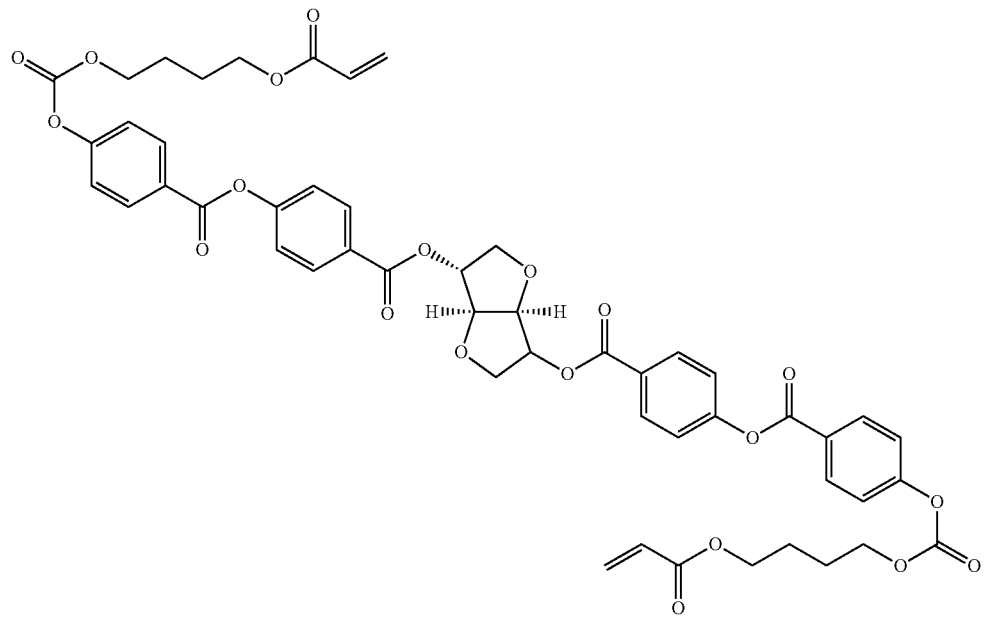
[Formula 1-2]
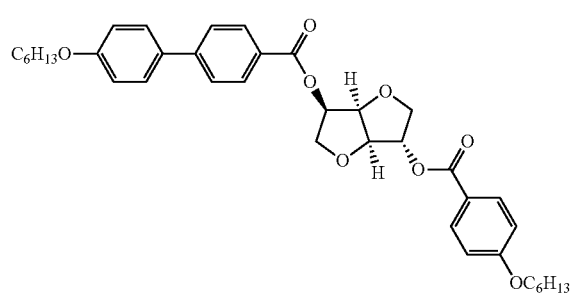
[Formula 1-3]
[Formula 1-4]
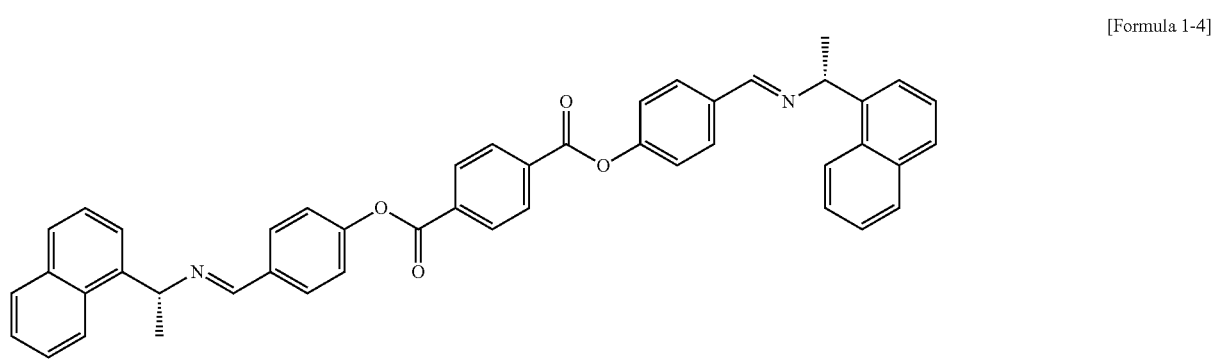
[Formula 1-5]
[Formula 1-6]
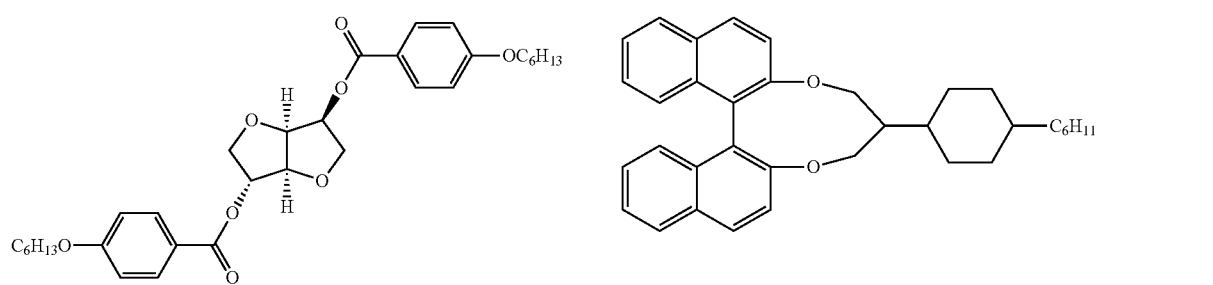

[Formula 1-7]
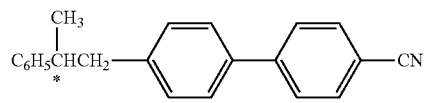
[Formula 1-8]
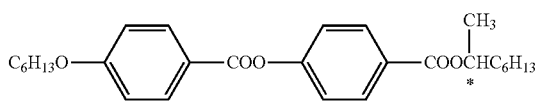
[Formula 1-9]
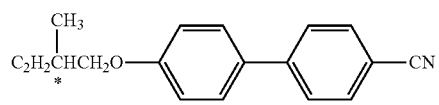
[Formula 1-10]
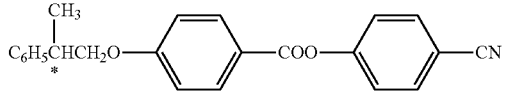
[Formula 1-11]
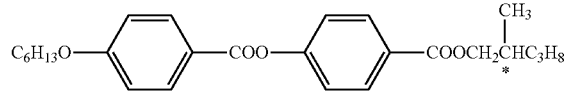
[Formula 1-12]
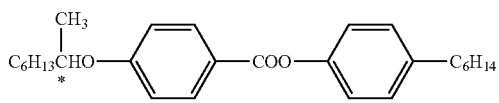
[Formula 1-13]
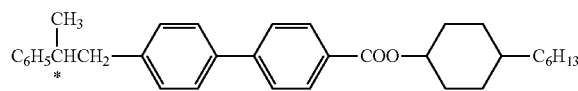
[Formula 1-14]
[Formula 1-15]
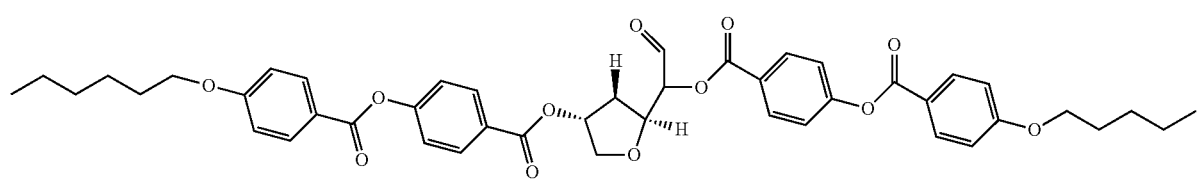
[Formula 1-16]
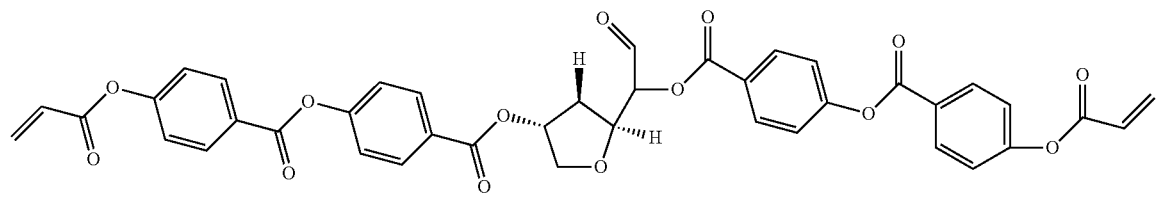
In one embodiment, the nematic liquid crystal monomer having at least one photopolymerizable acrylic functional group may be a compound represented by one of [Formula 2] to [Formula 7]. The above-mentioned compounds may be used alone or in combination of two or more.
[Formula 2]
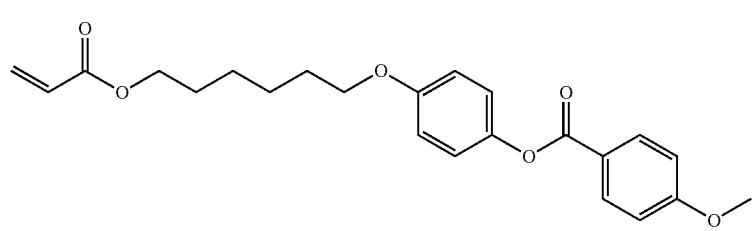
[Formula 3]
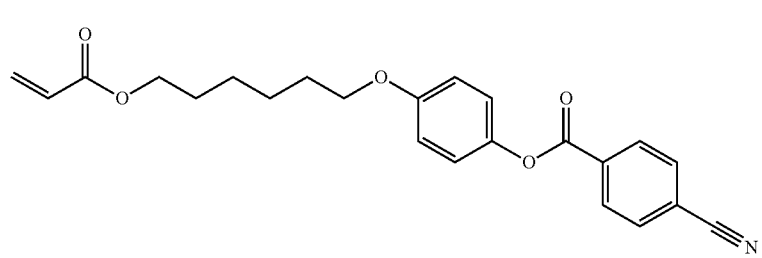

-continued

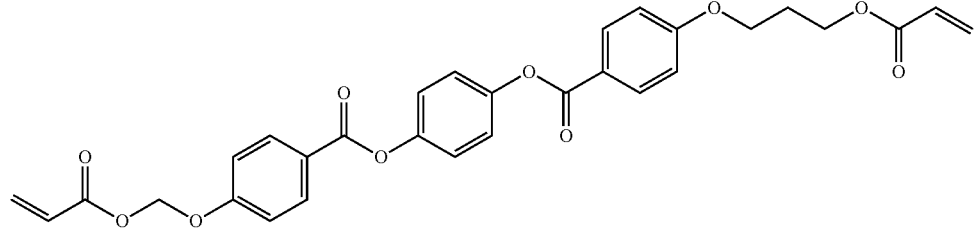

[Formula 4]

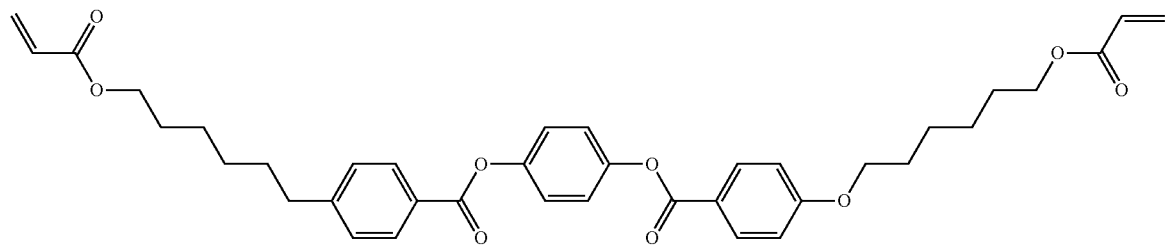

[Formula 5]

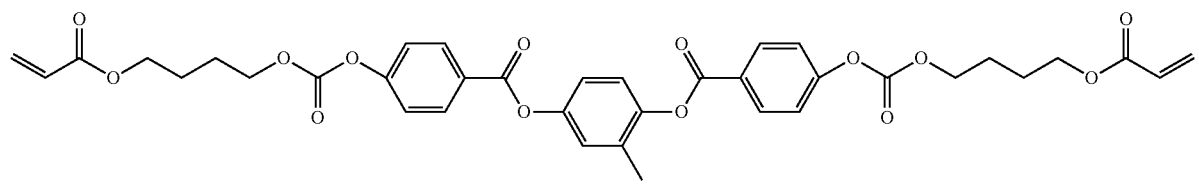

[Formula 6]

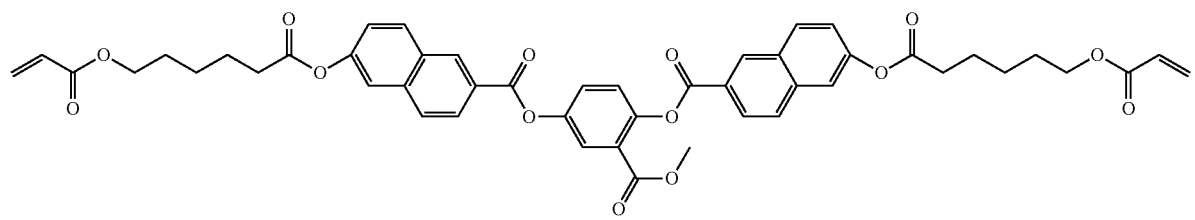

[Formula 7]

The light color conversion material of the embodiment of the present disclosure may be prepared by mixing the optical active substance with the nematic liquid crystal monomer having at least one photopolymerizable acrylic functional group, but the present disclosure is not limited thereto.

In addition, the quantum dot may be made by any well-known quantum dot material, which is not limited in the present disclosure. For example, the quantum dot may be a single-core quantum dot, a core-shell quantum dot or an alloy quantum dot. The material of the quantum dot may be group II-VI compound, group III-V compound or group IV-VI compound. The group II-VI compound may be CdSe, the group III-V compound may be InP, and the group IV-VI compound may be PbS, but the present disclosure is not limited thereto. Structurally, the quantum dot may have a ligand, a monomer layer, a polymer layer, an inorganic layer or a combination thereof. The shape of the quantum dot may be dot-like, rod-like, polygonal or irregular, but the present disclosure is not limited thereto.

The light color conversion material of the embodiment of the present disclosure may be mixed into a solvent to prepare a light color conversion ink of the embodiment of the present disclosure. The solvent may be toluene, cyclopentanone, cyclohexanone, propylene glycol methyl ether acetate (PG-MEA) or methyl ethyl ketone (MEK). For example, the light color conversion material of the embodiment of the present disclosure may be mixed into toluene to obtain a light color conversion ink having a solid content of 30%, but the present disclosure is not limited thereto.

The light color conversion ink of the embodiment of the present disclosure may be coated on a substrate and subjected to light treatment, so that a cross-linking reaction of the cross-linkable cholesteric liquid crystal material may be generated. After the solvent in the light color conversion ink is volatilized, the light color conversion layer of the embodiment of the present disclosure may be formed. The light color conversion layer formed by the light color conversion ink of the embodiment of the present disclosure may have a high optical density, thus improving the luminous intensity and the light color conversion efficiency. When the light color conversion layer is applied to a light-emitting device of the display, the display may have better performance.

The effects of the light color conversion layer of the embodiment of the present disclosure will be described below with Experimental examples and Comparative examples.

Quantum Dot

Green core-shell quantum dots and red core-shell quantum dots purchased from TWNC were used, wherein the material of the core was CdSe and the material of the shell was ZnS. The emission wavelengths of green core-shell quantum dots and the red core-shell quantum dots were 528 nm and 630 nm, respectively, and the FWHM (full width at half maximum) were 19 nm and 25 nm, respectively, and the quantum efficiencies of both were greater than 90%.

Cross-Linkable Cholesteric Liquid Crystal Material

A cross-linkable cholesteric liquid crystal material was prepared by mixing the optical active substance represented by [Formula 1-1] with a nematic liquid crystal monomer represented by [Formula 6], wherein the concentration of the optical active substance was about 6% of the content of the nematic liquid crystal monomer, so that light with wavelength between 400 nm and 480 nm may be reflected by the cross-linked cholesteric liquid crystal material and transmitted through the cross-linked cholesteric liquid crystal material at the same time.

Light Color Conversion Ink

EXPERIMENTAL EXAMPLE

The quantum dots were mixed with a cross-linkable cholesteric liquid crystal material to obtain a light color conversion material. The light color conversion material was added to toluene, and then oscillated and dispersed with ultrasonic waves for 2 hours. In this way, the quantum dots were encapsulated by the cross-linkable cholesteric liquid crystal material, and a light color conversion ink was prepared.

COMPARATIVE EXAMPLE

Isodecyl acrylate and 1,6-hexanediol diacrylate were mixed, the quantum dots and toluene were added, and then oscillated and dispersed with ultrasonic waves for 2 hours. In this way, a light color conversion ink having a solid content of 30% was prepared.

Light Color Conversion Layer

The light color conversion inks of the Experimental examples and the Comparative examples were respectively coated on a polyethylene terephthalate (PET) film with a thickness of 50 μm at a rotation speed of 200 rpm. After drying at 90° C., an exposure treatment was performed with a UV 365 nm light source (dose of 500 mJ) to form light color conversion layers with a thickness of 9 μm to 10 μm.

Luminous Intensity Test and Optical Density Test

The light color conversion layers of the Experimental examples and the Comparative examples were irradiated with a blue light-emitting diode (maximum wavelength of about 447 nm), and a spectrometer (Ocean Optics USB4000 Spectrometer) was used to measure the maximum luminous intensity, relative to the same blue light condition, at the position (at about 528 nm for green light, and at about 630 nm for red light) where the emission wavelength was converted after the quantum dots were irradiated. The degree of extinction of the blue light-emitting diode by the light color conversion layer, i.e., the optical density (OD), was calculated to measure and calculate the relative luminous intensity and the optical density. The results were shown in Table 1.

The optical density was calculated as follows.

$$OD = -\log(\text{intensity 2}/\text{intensity 1})$$

The intensity 1 is the luminous intensity of the original blue light, and the intensity 2 is the remaining blue luminous intensity after being transmitted through the light color conversion layer.

TABLE 1

|  | light | QD weight (g) | cross-linkable cholesteric liquid crystal material weight (g) | total weight of isodecyl acrylate and 1,6-hexanediol diacrylate (g) | maximum luminous intensity (counts) | OD |
|---|---|---|---|---|---|---|
| Experimental example 1 | green | 0.150 | 3 | — | 2372 | 0.028 |
| Experimental example 2 |  | 0.375 | 3 | — | 3824 | 0.070 |
| Experimental example 3 |  | 0.750 | 3 | — | 4196 | 0.136 |
| Experimental example 4 | red | 0.150 | 3 | — | 2324 | 0.097 |
| Experimental example 5 |  | 0.375 | 3 | — | 6320 | 0.150 |
| Experimental example 6 |  | 0.750 | 3 | — | 7112 | 0.238 |
| Comparative Example 1 | green | 0.150 | — | 3 | 1425 | 0.015 |
| Comparative Example 2 |  | 0.375 | — | 3 | 2762 | 0.062 |
| Comparative Example 3 |  | 0.750 | — | 3 | 3073 | 0.101 |
| Comparative Example 4 | red | 0.150 | — | 3 | 1420 | 0.029 |
| Comparative Example 5 |  | 0.375 | — | 3 | 2500 | 0.007 |
| Comparative Example 6 |  | 0.750 | — | 3 | 4069 | 0.108 |

*The green quantum dots were used un the Experimental examples 1, 2 and 3 and the Comparative examples 1, 2 and 3 used, and the red quantum dots were used in the Experimental examples 4, 5 and 6 and the Comparative examples 4, 5 and 6.

As shown in Table 1, in the light color conversion layers formed by the light color conversion material of the embodiment of the present disclosure, since the light color conversion material contains a cross-linkable cholesteric liquid crystal material which has Bragg diffraction characteristic after being cross-linked, the blue light with a wavelength between 400 nm and 480 nm may be reflected by the cross-linked cholesteric liquid crystal material and transmitted through the cross-linked cholesteric liquid crystal material at the same time. As a result, the incident light with wavelength between 400 nm and 480 nm may break through the energy gap of the quantum dot, thus improving the absorption of the incident light by the light color conversion layer, so that the light color conversion layer may have a higher optical density, and thus the luminous intensity and light color conversion efficiency are improved.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light color conversion ink, comprising:
a solvent; and
a light color conversion material, dispersed in the solvent and comprising:
quantum dots; and
a cholesteric liquid crystal material encapsulating quantum dots,
wherein the cholesteric liquid crystal material has Bragg diffraction characteristics for a blue light with an incident wavelength between 400 nm to 480 nm, and the blue light can be coupled through multiple reflections and transmissions of the cholesteric liquid crystal material to improve absorption of the quantum dots to the irradiation of the blue light, and
the cholesteric liquid crystal material is cross-linkable cholesteric liquid crystal and comprises an optical active substance and a nematic liquid crystal monomer having at least one photopolymerizable acrylic functional group.

2. The light color conversion ink of claim 1, wherein the quantum dot comprises a single-core quantum dot, a core-shell quantum dot or an alloy quantum dot.

3. The light color conversion ink of claim 1, wherein the solvent comprises toluene, cyclopentanone, cyclohexanone, propylene glycol methyl ether acetate (PGMEA) or methyl ethyl ketone.

4. The light color conversion ink of claim 1, wherein the optical active substance comprises at least one compound represented by one of [Formula 1-1] to [Formula 1-16],

[Formula 1-1]

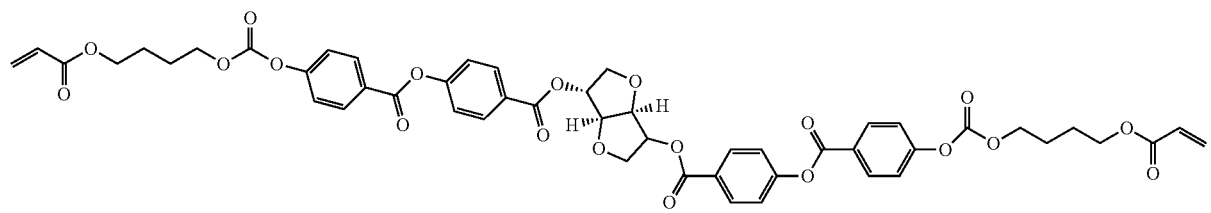

[Formula 1-2]

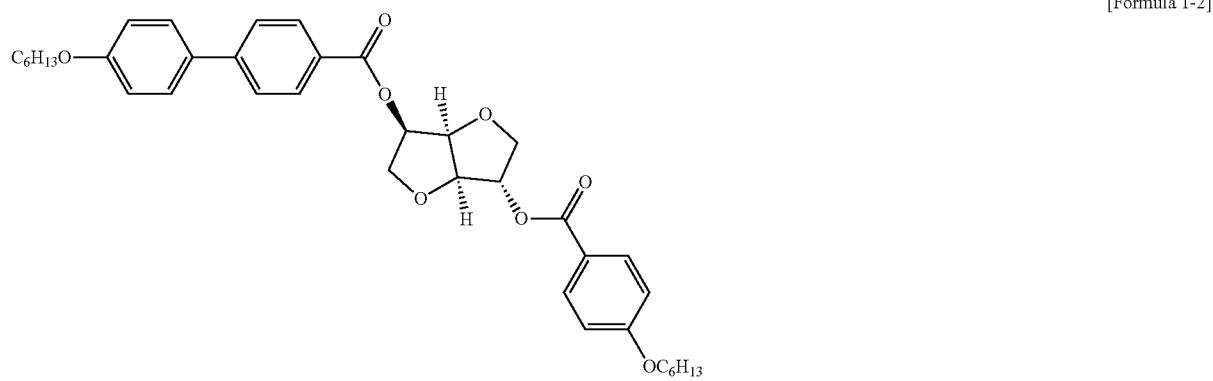

[Formula 1-3]

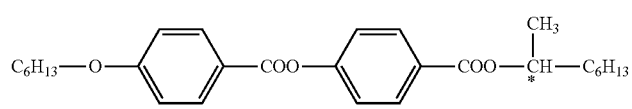

-continued
[Formula 1-4]
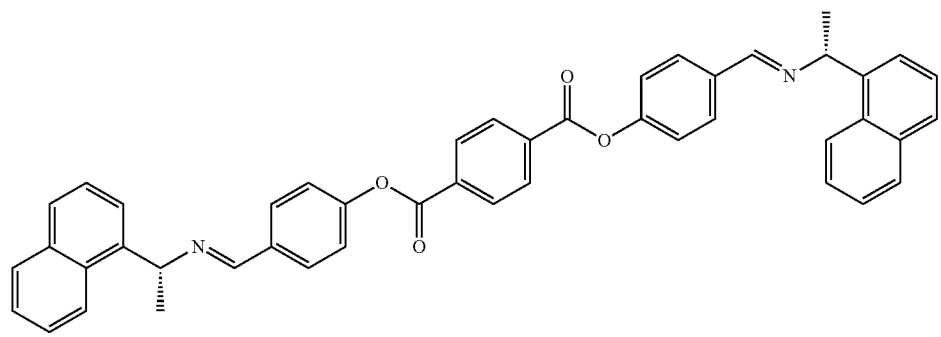
[Formula 1-5] [Formula 1-6]
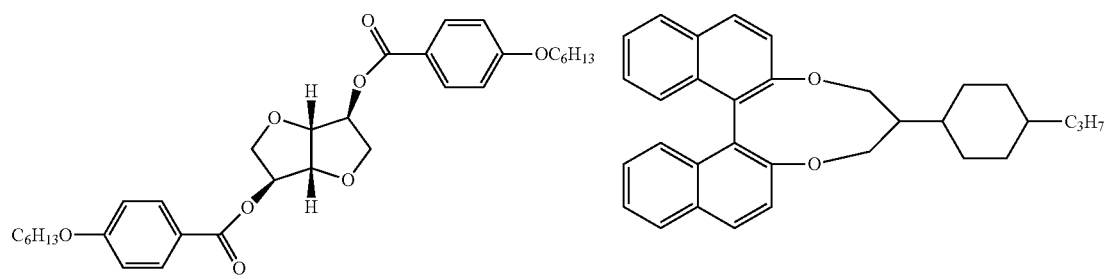
[Formula 1-7] [Formula 1-8]
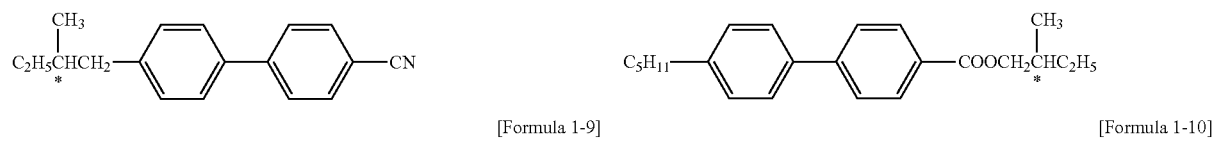
[Formula 1-9] [Formula 1-10]
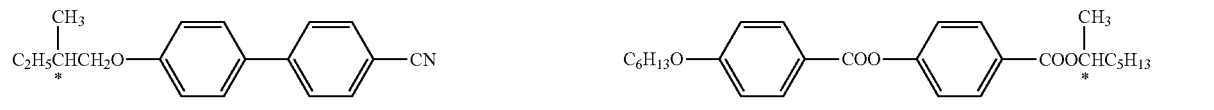
[Formula 1-11] [Formula 1-12]
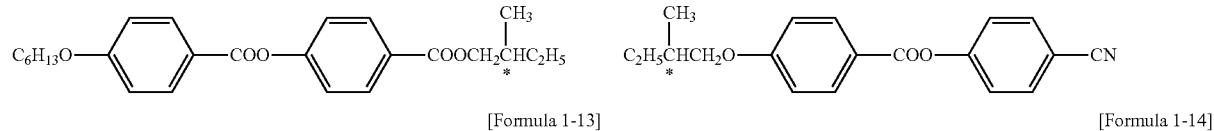
[Formula 1-13] [Formula 1-14]
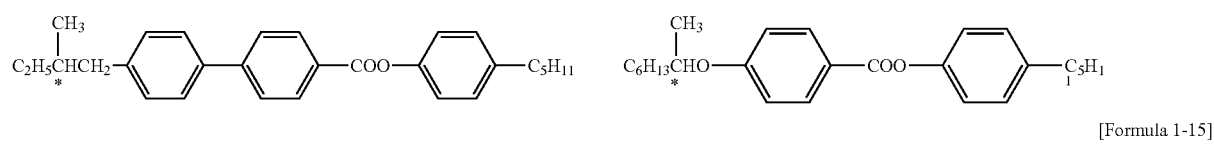
[Formula 1-15]
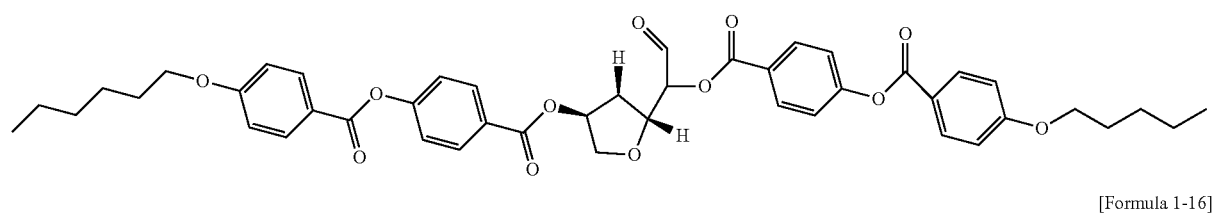
[Formula 1-16]
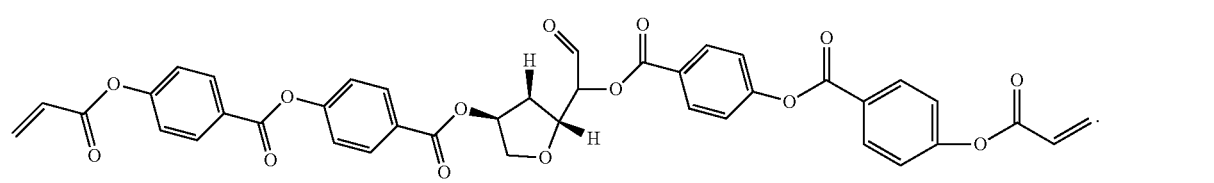

5. The light color conversion ink of claim 1, wherein the nematic liquid crystal monomer having at least one photopolymerizable acrylic functional group comprises at least one compound represented by one of [Formula 2] to [Formula 7],

[Formula 2]
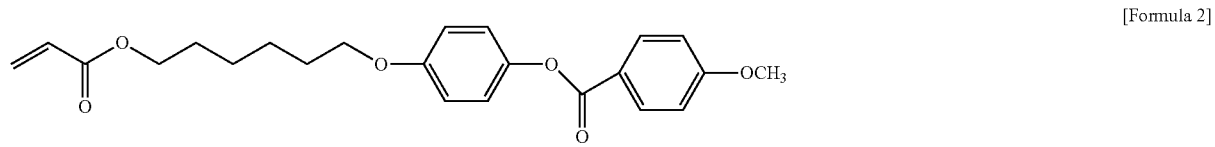

[Formula 3]
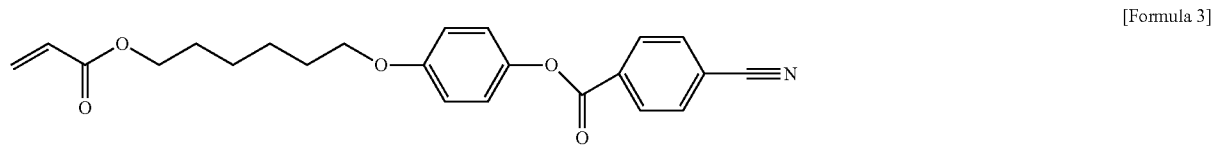

[Formula 4]
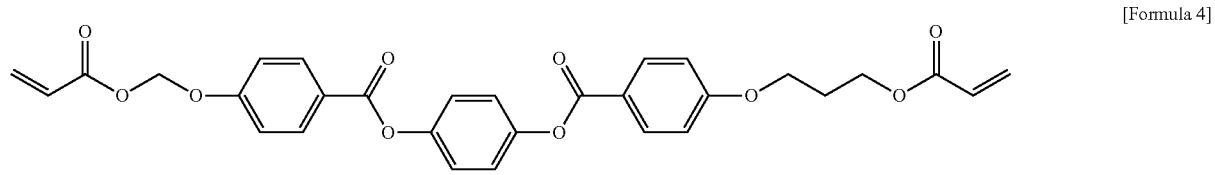

[Formula 5]
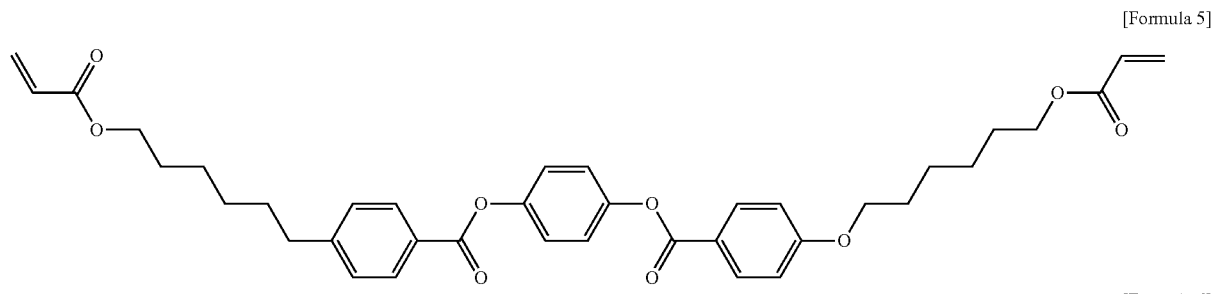

[Formula 6]
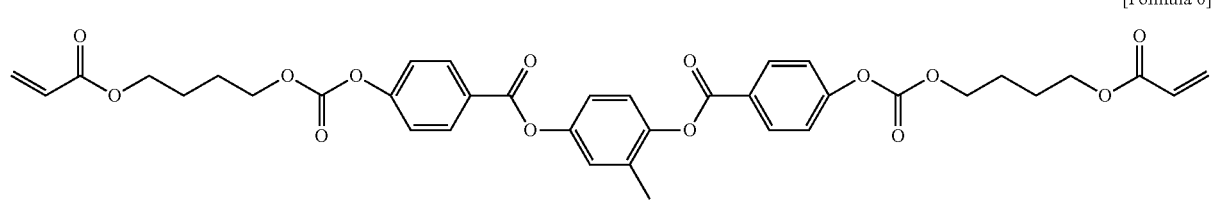

[Formula 7]
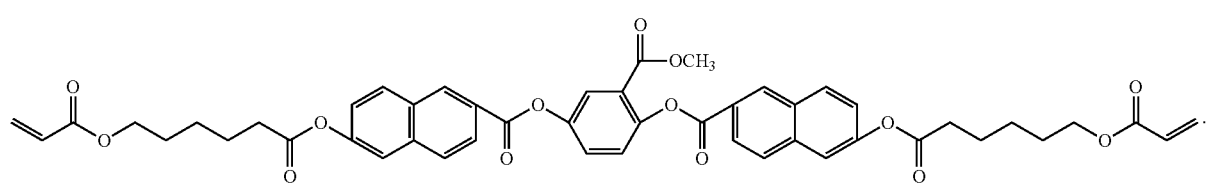

6. The light color conversion ink of claim 1, wherein a material of the quantum dots comprises a group II-VI compound, a group III-V compound or a group IV-VI compound formed from groups of the periodic table.

* * * * *